United States Patent
Ino (10) Patent No.: US 12,507,423 B2
(45) Date of Patent: Dec. 23, 2025

(54) MEMORY DEVICE AND CONDUCTIVE LAYER

(71) Applicant: Kioxia Corporation, Tokyo (JP)

(72) Inventor: Tsunehiro Ino, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 447 days.

(21) Appl. No.: 18/181,133

(22) Filed: Mar. 9, 2023

(65) Prior Publication Data

US 2024/0040804 A1   Feb. 1, 2024

(30) Foreign Application Priority Data

Jul. 27, 2022   (JP) .................................. 2022-119359

(51) Int. Cl.
*H10B 63/00*   (2023.01)
*H10B 43/27*   (2023.01)
(Continued)

(52) U.S. Cl.
CPC .......... *H10B 63/845* (2023.02); *H10B 43/27* (2023.02); *H10B 43/35* (2023.02); *H10B 63/10* (2023.02); *H10B 63/34* (2023.02)

(58) Field of Classification Search
CPC ...... H10B 63/845; H10B 43/27; H10B 43/35; H10B 63/10; H10B 63/34; H10B 63/20;
(Continued)

(56) References Cited

U.S. PATENT DOCUMENTS

| 5,310,603 A | 5/1994 | Fukuda et al. |
| 5,622,888 A | 4/1997 | Sekine et al. |

(Continued)

FOREIGN PATENT DOCUMENTS

| JP | 2001-524755 A | 12/2001 |
| JP | 2002-33484 A | 1/2002 |

(Continued)

OTHER PUBLICATIONS

Chang et al. ("Effects of W Content on Structural and Mechanical Properties of TaWN Films," Coatings, 12, 700, pp. 1-16, 2022) (Year: 2022).*

*Primary Examiner* — Yasser A Abdelaziz
(74) *Attorney, Agent, or Firm* — Oblon, McClelland, Maier & Neustadt, L.L.P.

(57) ABSTRACT

A memory device of embodiments includes: a semiconductor layer extending in a first direction; a gate electrode layer containing a first material or a second material, the first material containing tantalum (Ta), tungsten (W), and nitrogen (N), an atomic concentration of nitrogen being less than a sum of an atomic concentration of tantalum and an atomic concentration of tungsten, the second material containing niobium (Nb), molybdenum (Mo), and nitrogen (N), and an atomic concentration of nitrogen being less than a sum of an atomic concentration of niobium and an atomic concentration of molybdenum; a charge storage layer provided between the semiconductor layer and the gate electrode layer; a first insulating layer provided between the semiconductor layer and the charge storage layer; and a second insulating layer provided between the charge storage layer and the gate electrode layer.

26 Claims, 6 Drawing Sheets

(51) Int. Cl.
*H10B 43/35* (2023.01)
*H10B 63/10* (2023.01)

(58) Field of Classification Search
CPC .. H10N 70/841; H10N 70/231; H10N 70/823; H10N 70/8828
See application file for complete search history.

(56) References Cited

U.S. PATENT DOCUMENTS

| | | |
|---|---|---|
| 5,952,687 A | 9/1999 | Kawakubo et al. |
| 5,976,928 A | 11/1999 | Kirlin et al. |
| 6,087,261 A | 7/2000 | Nishikawa et al. |
| 6,111,318 A | 8/2000 | Hoshino |
| 6,287,965 B1 | 9/2001 | Kang et al. |
| 6,346,741 B1 | 2/2002 | Van Buskirk et al. |
| 6,984,591 B1 | 1/2006 | Buchanan et al. |
| 7,592,257 B2 | 9/2009 | Ishizaka |
| 9,997,569 B2 * | 6/2018 | Yamaguchi ............ H10B 63/80 |
| 2002/0027246 A1 | 3/2002 | Kunikiyo |
| 2004/0071879 A1 | 4/2004 | Callegari et al. |
| 2004/0092073 A1 | 5/2004 | Cabral, Jr. et al. |
| 2006/0138603 A1 | 6/2006 | Cabral, Jr. et al. |
| 2014/0061773 A1 * | 3/2014 | Higuchi ................. H10D 30/69 257/326 |
| 2014/0299938 A1 | 10/2014 | Zhang et al. |
| 2016/0118307 A1 | 4/2016 | Zhang et al. |
| 2017/0011971 A1 | 1/2017 | Zhang et al. |
| 2019/0189555 A1 | 6/2019 | Reznicek et al. |
| 2019/0198605 A1 | 6/2019 | Reznicek et al. |
| 2020/0119136 A1 | 4/2020 | Reznicek et al. |
| 2020/0130061 A1 | 4/2020 | Okamura et al. |
| 2021/0050512 A1 * | 2/2021 | Fugazza ............... H10N 70/882 |

FOREIGN PATENT DOCUMENTS

| | | |
|---|---|---|
| JP | 2002-60944 A | 2/2002 |
| JP | 2004-31 407 A | 1/2004 |
| JP | 2004-31497 A | 1/2004 |
| JP | 3949373 B2 | 7/2007 |

* cited by examiner

MEMORY DEVICE AND CONDUCTIVE LAYER

CROSS-REFERENCE TO RELATED APPLICATION

This application is based upon and claims the benefit of priority from Japanese Patent Application No. 2022-119359, filed on Jul. 27, 2022, the entire contents of which are incorporated herein by reference.

FIELD

Embodiments described herein relate generally to a memory device and a conductive layer.

BACKGROUND

In a memory device, the electrical resistance of a conductive layer may vary due to heat treatment during manufacturing. In order to suppress variation in electrical resistance due to heat treatment, it is desirable to use a highly heat-resistant material for the conductive layer.

DETAILED DESCRIPTION

A memory device of embodiments includes: a semiconductor layer extending in a first direction; a gate electrode layer containing a first material or a second material, the first material containing tantalum (Ta), tungsten (W), and nitrogen (N), an atomic concentration of nitrogen in the first material being less than a sum of an atomic concentration of tantalum and an atomic concentration of tungsten, the second material containing niobium (Nb), molybdenum (Mo), and nitrogen (N), and an atomic concentration of nitrogen in the second material being less than a sum of an atomic concentration of niobium and an atomic concentration of molybdenum; a charge storage layer provided between the semiconductor layer and the gate electrode layer; a first insulating layer provided between the semiconductor layer and the charge storage layer; and a second insulating layer provided between the charge storage layer and the gate electrode layer.

Hereinafter, embodiments will be described with reference to the diagrams. In addition, in the following description, the same or similar members and the like are denoted by the same reference numerals, and the description of the members and the like once described will be omitted as appropriate.

The qualitative analysis and quantitative analysis of the chemical composition of members configuring the memory device in this specification can be performed by, for example, secondary ion mass spectroscopy (SIMS), energy dispersive X-ray spectroscopy (EDX), electron energy loss spectroscopy (EELS), X-ray photoelectron spectroscopy (XPS), or the like. In addition, when measuring the thickness of each member forming the memory device, a distance between members, and the like, for example, a transmission electron microscope (TEM) can be used. In addition, for the identification of the crystal system of the constituent material of each member configuring the memory device and the comparison of the abundance ratio of the crystal systems, for example, a transmission electron microscope, X-ray diffraction (XRD), electron beam diffraction (EBD), X-ray photoelectron spectroscopy, or synchrotron radiation X-ray absorption fine structure (XAFS) can be used.

First Embodiment

A memory device according to a first embodiment includes: a semiconductor layer extending in a first direction; a gate electrode layer containing a first material or a second material, the first material containing tantalum (Ta), tungsten (W), and nitrogen (N), an atomic concentration of nitrogen in the first material being less than a sum of an atomic concentration of tantalum and an atomic concentration of tungsten, the second material containing niobium (Nb), molybdenum (Mo), and nitrogen (N), and an atomic concentration of nitrogen in the second material being less than a sum of an atomic concentration of niobium and an atomic concentration of molybdenum; a charge storage layer provided between the semiconductor layer and the gate electrode layer; a first insulating layer provided between the semiconductor layer and the charge storage layer; and a second insulating layer provided between the charge storage layer and the gate electrode layer.

The memory device according to the first embodiment is a 3D NAND flash memory. A memory cell of the memory device according to the first embodiment is a so-called metal-oxide-nitride-oxide-semiconductor type (MONOS type) memory cell.

Figure 1:
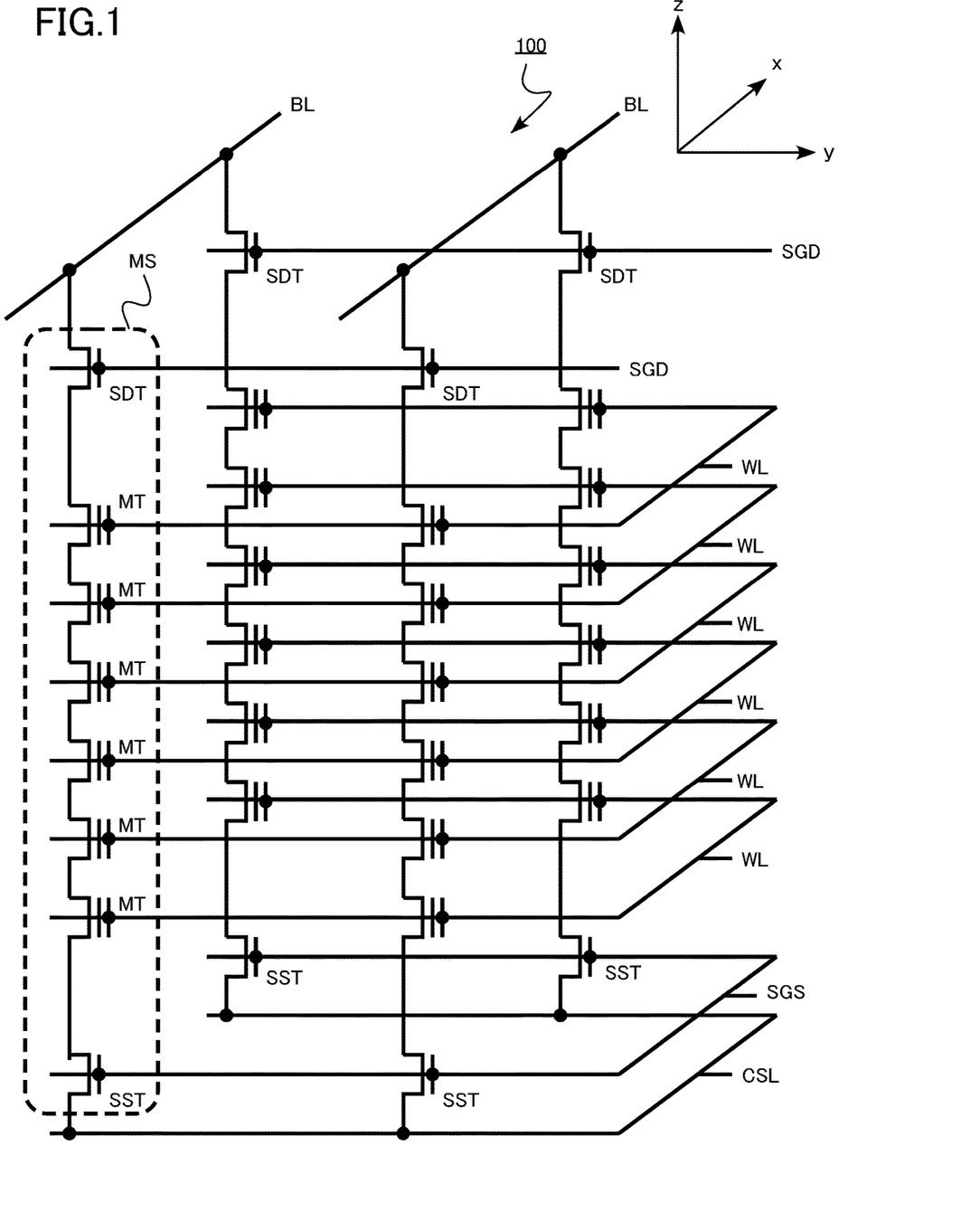
FIG. 1 is a circuit diagram of a memory cell array of a memory device according to a first embodiment.

FIG. 1 is a circuit diagram of a memory cell array of the memory device according to the first embodiment.

As shown in FIG. 1, a memory cell array 100 of the 3D NAND flash memory according to the first embodiment includes a plurality of word lines WL, a common source line CSL, a source selection gate line SGS, a plurality of drain selection gate lines SGD, a plurality of bit lines BL, and a plurality of memory strings MS.

The plurality of word lines WL are arranged so as to be spaced from each other in the z direction. The plurality of word lines WL are arranged so as to be stacked in the z direction. The plurality of memory strings MS extend in the z direction. The plurality of bit lines BL extend in the x direction, for example.

Hereinafter, the x direction is defined as a third direction, the y direction is defined as a second direction, and the z direction is defined as a first direction. The x direction, the y direction, and the z direction cross each other. For example, the x direction, the y direction, and the z direction are perpendicular to each other.

As shown in FIG. 1, each memory string MS includes a source selection transistor SST, a plurality of memory cells, and a drain selection transistor SDT connected in series to each other between the common source line CSL and the bit line BL. One memory string MS can be selected by selecting one bit line BL and one drain selection gate line SGD, and one memory cell can be selected by selecting one word line WL. The word line WL is a gate electrode of a memory cell transistor MT forming the memory cell.

Figure 2A:
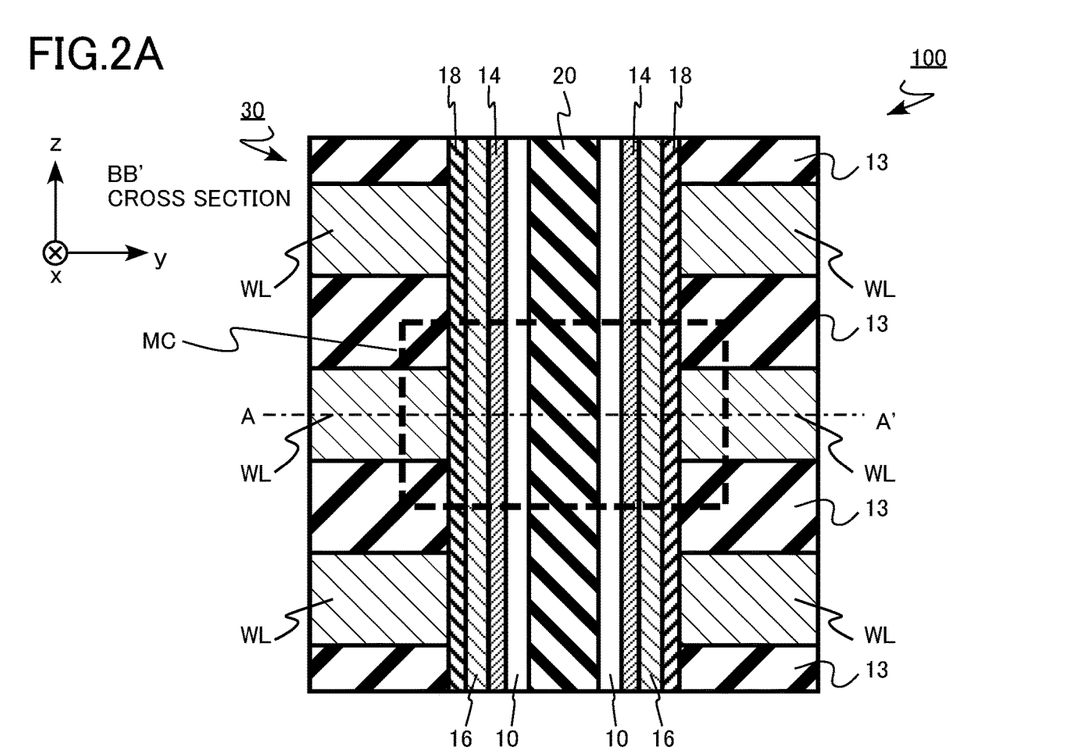
FIGS. 2A and 2B are schematic cross-sectional views of the memory cell array of the memory device according to the first embodiment.
Figure 2B:
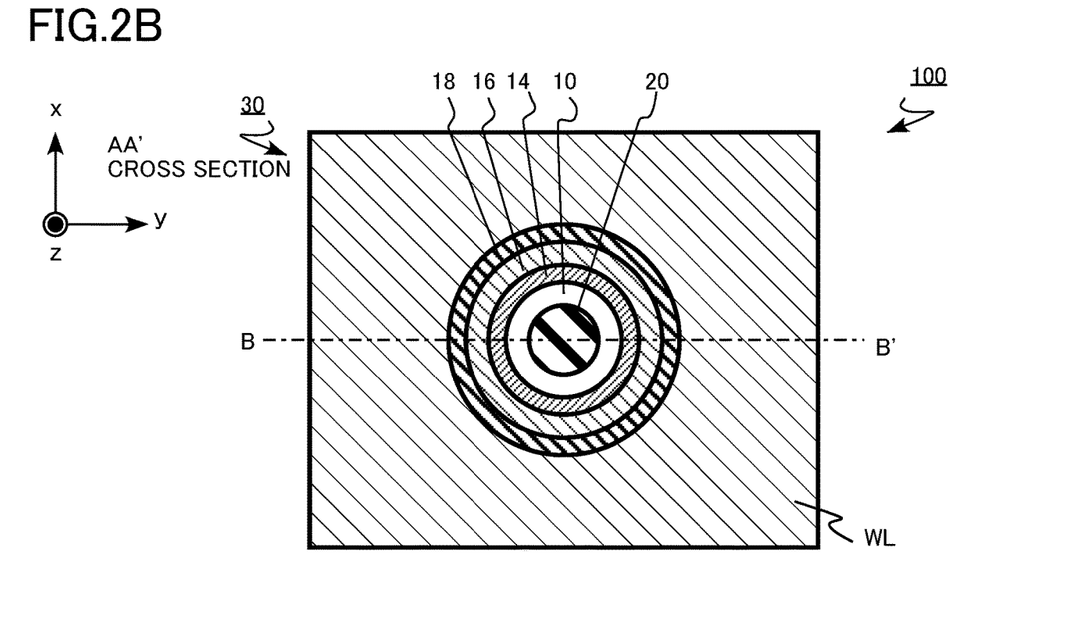

FIGS. 2A and 2B are schematic cross-sectional views of the memory cell array of the memory device according to the first embodiment. FIGS. 2A and 2B show cross sections of a plurality of memory cells in one memory string MS in the memory cell array 100 shown in FIG. 1.

FIG. 2A is a yz cross-sectional view of the memory cell array 100. FIG. 2A is a cross-sectional view taken along the line BB' of FIG. 2B. FIG. 2B is an xy cross-sectional view of the memory cell array 100. FIG. 2B is a cross-sectional view taken along the line AA' of FIG. 2A. In FIG. 2A, the region surrounded by the dotted line is one memory cell.

Figure 3:
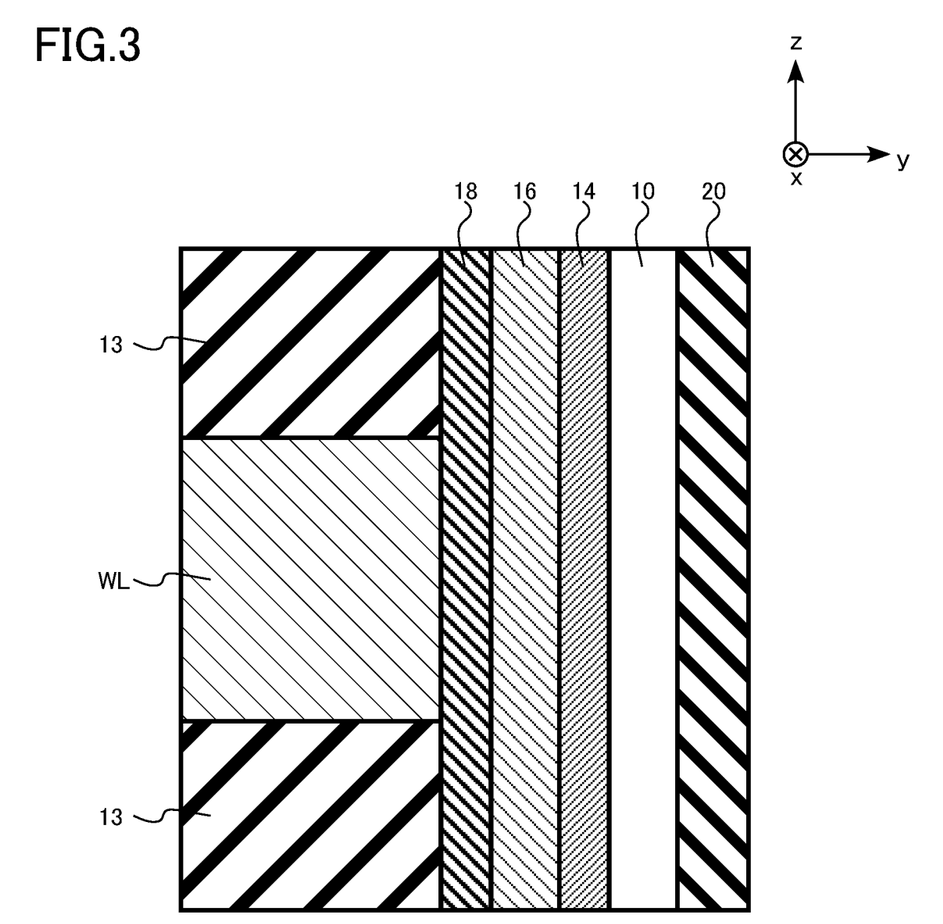
FIG. 3 is an enlarged view of a part of a memory cell of the memory device according to the first embodiment.

FIG. 3 is an enlarged view of a part of the memory cell of the memory device according to the first embodiment. FIG. 3 is an enlarged view of a part of FIG. 2A.

As shown in FIGS. 2A, 2B, and 3, the memory cell array 100 includes the word line WL, a semiconductor layer an interlayer insulating layer 13, a tunnel insulating layer 14, a charge storage layer 16, a block insulating layer 18, a core insulating region 20. A plurality of word lines WL and a plurality of interlayer insulating layers 13 form a stacked body 30.

The word line WL is an example of a gate electrode layer. The word line WL is an example of a conductive layer. The tunnel insulating layer 14 is an example of a first insulating layer. The block insulating layer 18 is an example of a second insulating layer.

The memory cell array 100 is provided, for example, on a semiconductor substrate (not shown). The semiconductor substrate has, for example, a surface parallel to the x and y directions.

The word line WL and the interlayer insulating layer 13 are alternately stacked in the z direction on the semiconductor substrate. The word lines WL are repeatedly arranged in the z direction so as to be spaced from each other. The word line WL functions as a control electrode of the memory cell transistor MT.

The word line WL is a plate-shaped conductor.

The word line WL contains a first material or a second material. For example, the entire region of the word line WL is formed of a first material or a second material.

The first material contains tantalum (Ta), tungsten (W), and nitrogen (N), and the atomic concentration of nitrogen is less than the sum of the atomic concentration of tantalum and the atomic concentration of tungsten. The second material contains niobium (Nb), molybdenum (Mo), and nitrogen (N), and the atomic concentration of nitrogen is less than the sum of the atomic concentration of niobium and the atomic concentration of molybdenum.

The word line WL contains, for example, a first material. The main components of the first material are tantalum, tungsten, and nitrogen. The fact that the main components of the first material are tantalum, tungsten, and nitrogen means that there is no element having a higher atomic concentration than tantalum, tungsten, or nitrogen among the elements contained in the first material. The total atomic concentration of tantalum, tungsten, and nitrogen contained in the first material is, for example, equal to or more than 80% (percent).

The first material contains, for example, tantalum tungsten nitride. The first material is, for example, tantalum tungsten nitride.

The word line WL is formed of, for example, the first material. The word line WL contains, for example, tantalum tungsten nitride. The word line WL is, for example, a tantalum tungsten nitride layer.

The atomic concentration of nitrogen in the first material is less than the sum of the atomic concentration of tantalum and the atomic concentration of tungsten. The atomic concentration of nitrogen in the first material is, for example, equal to or more than 80% (percent) and equal to or less than 95% (percent) of the sum of the atomic concentration of tantalum and the atomic concentration of tungsten.

The atomic concentration of tantalum in the first material is, for example, equal to or more than 0.3 times and equal to or less than 3.3 times the atomic concentration of tungsten.

The word line WL contains, for example, the second material. The main components of the second material are niobium, molybdenum, and nitrogen. The fact that the main components of the second material are niobium, molybdenum, and nitrogen means that there is no element having a higher atomic concentration than niobium, molybdenum, or nitrogen among the elements contained in the second material. The total atomic concentration of niobium, molybdenum, and nitrogen contained in the second material is, for example, equal to or more than 80%.

The second material contains, for example, niobium molybdenum nitride. The second material is, for example, niobium molybdenum nitride.

The word line WL is formed of, for example, the second material. The word line WL contains, for example, niobium molybdenum nitride. The word line WL is, for example, a niobium molybdenum nitride layer.

The atomic concentration of nitrogen in the second material is less than the sum of the atomic concentration of niobium and the atomic concentration of molybdenum. The atomic concentration of the second material is, for example, equal to or more than 80% and equal to or less than 95% of the sum of the atomic concentration of niobium and the atomic concentration of molybdenum.

The atomic concentration of niobium in the second material is, for example, equal to or more than 0.3 times and equal to or less than 3.3 times the atomic concentration of molybdenum.

The first material and the second material contain, for example, oxygen (O). The atomic concentration of oxygen contained in the first material and the second material is, for example, equal to or more than 5 atomic % and equal to or less than 20 atomic %.

The first material and the second material include, for example, a polycrystalline portion. For example, all portions of the first material and the second material are polycrystalline portions.

In the polycrystalline portion of the first material and the second material, for example, the atomic concentration of oxygen in a crystal grain is lower than the atomic concentration of oxygen at crystal grain boundary. In the polycrystalline portion of the first material and the second material, for example, oxygen segregates at the crystal grain boundary.

The first material and the second material contain, for example, at least one element selected from the group consisting of carbon (C), chlorine (Cl), hydrogen (H), and deuterium (D). The atomic concentration of the at least one element contained in the first material and the second material is, for example, equal to or more than 5 atomic % and equal to or less than 20 atomic %.

The first material and the second material are, for example, polycrystalline. In the X-ray diffraction of the first material and the second material using Cu-Kα rays, for example, the full width at half maximum (FWHM) of the diffraction peak present in the range of a diffraction angle 2θ (two theta) equal to or more than 15° (degree) and equal to or less than 30° (degree) is equal to or more than 1.3° (degree) and equal to or less than 5° (degree).

The thickness of the word line WL in the z direction is, for example, equal to or more than 5 nm and equal to or less than 20 nm.

The word line WL is formed by depositing a film of the first material or a film of the second material using a chemical vapor deposition (CVD) method, for example. By adjusting the composition of the source gas when forming the word line WL using the CVD method, it is possible to deposit the film of the first material or the film of the second material with a desired chemical composition.

The interlayer insulating layer 13 is provided in the z direction of the word line WL. The word line WL and the interlayer insulating layer 13 are arranged in the z direction.

The interlayer insulating layer 13 separates the word line WL and the word line WL from each other. The interlayer insulating layer 13 electrically separates the word line WL and the word line WL from each other.

The interlayer insulating layer 13 is, for example, an oxide, an oxynitride, or a nitride. The interlayer insulating layer 13 contains, for example, silicon (Si) and oxygen (O). The interlayer insulating layer 13 contains, for example, silicon oxide. The interlayer insulating layer 13 is, for example, a silicon oxide layer. The thickness of the interlayer insulating layer 13 in the z direction is, for example, equal to or more than 5 nm and equal to or less than 20 nm.

The semiconductor layer 10 is provided in the stacked body 30. The semiconductor layer 10 extends in the z direction. The semiconductor layer 10 extends in a direction perpendicular to the surface of the semiconductor substrate.

The semiconductor layer 10 is provided so as to penetrate the stacked body 30. The semiconductor layer 10 is surrounded by a plurality of word lines WL. The semiconductor layer 10 is, for example, cylindrical. The semiconductor layer 10 functions as a channel of the memory cell transistor MT.

The semiconductor layer 10 is, for example, a polycrystalline semiconductor. The semiconductor layer 10 is, for example, polycrystalline silicon.

The tunnel insulating layer 14 is provided between the semiconductor layer 10 and the word line WL. The tunnel insulating layer 14 is provided between the semiconductor layer 10 and the charge storage layer 16. The tunnel insulating layer 14 has a function of allowing a charge to pass according to a voltage applied between the word line WL and the semiconductor layer 10.

The tunnel insulating layer 14 contains, for example, silicon (Si), nitrogen (N), and oxygen (O). The tunnel insulating layer 14 contains, for example, silicon oxide, silicon nitride, or silicon oxynitride. The tunnel insulating layer 14 is, for example, a silicon oxide layer, a silicon nitride layer, or a silicon oxynitride layer. The thickness of the tunnel insulating layer 14 is, for example, equal to or more than 1 nm and equal to or less than 8 nm.

The charge storage layer 16 is provided between the tunnel insulating layer 14 and the block insulating layer 18.

The charge storage layer 16 has a function of trapping and storing a charge. The charge is, for example, an electron. The threshold voltage of the memory cell transistor MT changes according to the amount of charge stored in the charge storage layer 16. By using the threshold voltage change, one memory cell can store data. For example, when the threshold voltage of the memory cell transistor MT changes, the voltage at which the memory cell transistor MT is turned on changes. For example, if a state in which the threshold voltage is high is defined as data "0" and a state in which the threshold voltage is low is defined as data "1", the memory cell can store 1-bit data of "0" and "1".

The charge storage layer 16 is, for example, an insulator. The charge storage layer 16 contains, for example, silicon (Si) and nitrogen (N). The charge storage layer 16 contains, for example, silicon nitride. The charge storage layer 16 is, for example, a silicon nitride layer. The thickness of the charge storage layer 16 is, for example, equal to or more than 3 nm and equal to or less than 10 nm.

The block insulating layer 18 is provided between the tunnel insulating layer 14 and the word line WL. The block insulating layer 18 is provided between the charge storage layer 16 and the word line WL. The block insulating layer 18 has a function of blocking the current flowing between the charge storage layer 16 and the word line WL.

The block insulating layer 18 is an insulating layer. The block insulating layer 18 contains, for example, silicon (Si) and oxygen (O). The block insulating layer 18 contains, for example, silicon oxide. The block insulating layer 18 is, for example, a silicon oxide layer.

The block insulating layer 18 contains, for example, aluminum (Al) and oxygen (O). The block insulating layer 18 contains, for example, aluminum oxide. The block insulating layer 18 is, for example, an aluminum oxide layer.

The block insulating layer 18 has, for example, a stacked structure of a silicon oxide layer and an aluminum oxide layer.

The thickness of the block insulating layer 18 in the y direction from the semiconductor layer 10 toward the word line WL is, for example, equal to or more than 1 nm and equal to or less than 8 nm.

The core insulating region 20 is provided in the stacked body 30. The core insulating region 20 extends in the z direction. The core insulating region 20 is provided so as to penetrate the stacked body 30. The core insulating region 20 is surrounded by the semiconductor layer 10. The core insulating region 20 is surrounded by a plurality of word lines WL. The core insulating region 20 is columnar. The core insulating region 20 is, for example, cylindrical.

The core insulating region 20 is, for example, an oxide, an acid nitride, or a nitride. The core insulating region 20 contains, for example, silicon (Si) and oxygen (O). The core insulating region 20 contains, for example, silicon oxide. The core insulating region 20 is, for example, a silicon oxide layer.

Next, the function and effect of the memory device according to the first embodiment will be described.

When manufacturing the 3D NAND flash memory, heat treatment is performed during or after formation of memory cells. For example, the heat treatment is performed in order to modify the block insulating layer 18 in the memory cell or to form a multilayer wiring layer provided on the memory cell. The temperature of the heat treatment is, for example, equal to or more than 800° C. and equal to or less than 1150° C.

The electrical resistance of the word line WL may vary due to the heat treatment after forming the memory cell. For example, heat treatment may increase the electrical resistance of the word line WL. If the electrical resistance of the word line WL varies, the operation of the memory cell becomes unstable, for example. In order to stabilize the operation of the memory cell, it is desirable to use, as a material of the word line WL, a material with high heat resistance that causes a small variation in electrical resistance due to heat treatment. In addition, the fact that the electrical resistance of the word line WL is varied by the heat treatment may mean that the constituent material of the block insulating layer 18 in contact with the word line WL and the constituent material of the word line WL are mixed by the heat treatment. If the constituent material of the word line WL and the constituent material of the block insulating layer 18 are mixed by the heat treatment, the characteristics of the block insulating layer 18 are degraded and accordingly, the characteristics of the memory cell are degraded. In order to prevent such degradation of the memory cell, it is desirable to use, as a material of the word line WL, a material with high heat resistance that causes a small variation in electrical resistance due to heat treatment.

The word line WL of the 3D NAND flash memory according to the first embodiment contains the first material or the second material.

The first material contains tantalum (Ta), tungsten (W), and nitrogen (N), and the atomic concentration of nitrogen is less than the sum of the atomic concentration of tantalum and the atomic concentration of tungsten. In addition, the second material contains niobium (Nb), molybdenum (Mo), and nitrogen (N), and the atomic concentration of nitrogen is less than the sum of the atomic concentration of niobium and the atomic concentration of molybdenum.

The word line WL of the 3D NAND flash memory according to the first embodiment contains the first material or the second material. The first material and the second material have high heat resistance and small variation in electrical resistance when subjected to heat treatment.

By using the first material or the second material for the word line WL, it is possible to realize the word line WL with a small variation in electrical resistance due to heat treatment. By using the first material or the second material for the word line WL, an increase in the electrical resistance of the word line WL due to heat treatment is particularly suppressed.

By using the first material or the second material for the word line WL, especially when the thickness of the word line WL in the z direction is reduced, it is possible to suppress an increase in the electrical resistance of the word line WL due to heat treatment. By using the first material or the second material for the word line WL, especially when the thickness of the word line WL in the z direction is equal to or less than 10 nm, it is possible to suppress an increase in the electrical resistance of the word line WL due to heat treatment.

In order for a phase transformation of a material to occur, the phase existing in the system should be less stable than the phase existing in equilibrium (equilibrium phase). Phase stability under constant pressure conditions is defined by the Gibbs free energy. The Gibbs free energy G is defined by the following Equation. In the following Equation, U is internal energy, T is absolute temperature, S is entropy, P is pressure, and V is volume.

$$G=U-TS+PV$$

In a closed system under constant temperature and constant pressure, the system is said to be in equilibrium when the Gibbs free energy G is a minimum value. In other words, the system is in the most stable state when the Gibbs free energy G is the minimum value.

As can be seen from the above Equation, the larger the entropy S becomes, the smaller the Gibbs free energy G becomes. Therefore, a state of matter with a large entropy S has a small Gibbs free energy G, and a state of matter in which the Gibbs free energy G is further reduced is unlikely to exist. This effect increases as the temperature T of the system increases. Therefore, a state of matter with a large entropy S is considered to have high stability at high temperatures and have high heat resistance.

The entropy S is a physical quantity representing the microscopic disorder of the system. A state of matter with a large entropy S is, for example, a state of matter in which a large number of elements are mixed, a state of matter in which a homogeneous mixture is present, a state of matter in which phase separation is not performed, or a state of matter in which defect sites are present.

The first material of the first embodiment contains tantalum (Ta), tungsten (W), and nitrogen (N). The first material is, for example, tantalum tungsten nitride. Tantalum tungsten nitride formed of three elements is a state of matter having a larger entropy S than, for example, tantalum nitride or tungsten nitride formed of two elements.

In addition, in the first material, the atomic concentration of nitrogen is lower than the sum of the atomic concentration of tantalum and the atomic concentration of tungsten. The first material is, for example, a tantalum tungsten nitride in which the atomic concentration of nitrogen is less than the sum of the atomic concentration of tantalum and the atomic concentration of tungsten. The tantalum tungsten nitride, in which the atomic concentration of nitrogen is less than the sum of the atomic concentration of tantalum and the atomic concentration of tungsten, is a state of matter having a larger entropy S and a larger number of nitrogen defect sites than tantalum tungsten nitride, in which the atomic concentration of nitrogen is equal to the sum of the atomic concentration of tantalum and the atomic concentration of tungsten.

Since the first material of the first embodiment is a state of matter having a large entropy S, the first material of the first embodiment is considered to have high heat resistance and hardly causes variation in electrical resistance when subjected to heat treatment.

The second material of the first embodiment contains niobium (Nb), molybdenum (Mo), and nitrogen (N). The second material is, for example, niobium molybdenum nitride. Niobium molybdenum nitride formed of three elements is a state of matter having a larger entropy S than, for example, niobium nitride and molybdenum nitride formed of two elements.

In addition, in the second material, the atomic concentration of nitrogen is lower than the sum of the atomic concentration of niobium and the atomic concentration of molybdenum. The second material is, for example, a niobium molybdenum nitride in which the atomic concentration of nitrogen is less than the sum of the atomic concentration of niobium and the atomic concentration of molybdenum. The niobium molybdenum nitride, in which the atomic concentration of nitrogen is less than the sum of the atomic concentration of niobium and the atomic concentration of molybdenum, is a state of matter having a larger entropy S and a larger number of nitrogen defect sites than niobium molybdenum nitride, in which the atomic concentration of nitrogen is equal to the sum of the atomic concentration of niobium and the atomic concentration of molybdenum.

Since the second material of the first embodiment is a state of matter having a large entropy S, the second material of the first embodiment is considered to have high heat resistance and hardly causes variation in electrical resistance when subjected to heat treatment.

The atomic concentration of nitrogen in the first material is preferably equal to or more than 80% and equal to or less than 95% of the sum of the atomic concentration of tantalum and the atomic concentration of tungsten. By satisfying the above range, it is possible to realize a state of matter having a large entropy S. Therefore, the heat resistance of the first material is improved.

The atomic concentration of nitrogen in the second material is preferably equal to or more than 80% and equal to or less than 95% of the sum of the atomic concentration of niobium and the atomic concentration of molybdenum. By satisfying the above range, it is possible to realize a state of matter having a large entropy S. Therefore, the heat resistance of the second material is improved.

The atomic concentration of tantalum in the first material is preferably equal to or more than 0.3 times and equal to or less than 3.3 times the atomic concentration of tungsten. By satisfying the above range, it is possible to realize a state of matter having a large entropy S. Therefore, the heat resistance of the first material is improved.

The atomic concentration of niobium in the second material is preferably equal to or more than 0.3 times and equal to or less than 3.3 times the sum of the atomic concentration of molybdenum. By satisfying the above range, it is possible to realize a state of matter having a large entropy S. Therefore, the heat resistance of the second material is improved.

The first material and the second material preferably contain oxygen (O). Since the first material and the second material contain four or more elements, it is possible to realize state of matter having a larger entropy S. Therefore, the heat resistance of the first material and the second material is improved.

The atomic concentration of oxygen contained in the first material and the second material is preferably equal to or more than 5 atomic % and equal to or less than 20 atomic %. Since the atomic concentration of oxygen is higher than the above lower limit value, the entropy S increases to improve the heat resistance of the first material and the second material. In addition, since the atomic concentration of oxygen is lower than the above upper limit value, it is possible to reduce the electrical resistance of the first material and the second material.

Preferably, the first material and the second material include a polycrystalline portion, and in the polycrystalline portion, the atomic concentration of oxygen in the crystal grain is lower than the atomic concentration of oxygen at the crystal grain boundary. The heat resistance of the first material and the second material is improved.

It is preferable that the atomic concentration of at least one element selected from the group consisting of carbon (C), chlorine (Cl), hydrogen (H), and deuterium (D) contained in the first material and the second material is equal to or more than 5 atomic % and equal to or less than atomic %. Since the atomic concentration of the at least one element is higher than the above lower limit value, the entropy S increases to improve the heat resistance of the first material and the second material. In addition, since the atomic concentration of the at least one element is lower than the above upper limit value, it is possible to reduce the electrical resistance of the first material and the second material.

Preferably, in the X-ray diffraction of the first material and the second material using Cu-Kα rays, for example, the full width at half maximum of the diffraction peak present in the range of a diffraction angle 2θ (two theta) equal to or more than 15° (degree) and equal to or less than 30° (degree) is equal to or more than 1.3° (degree) and equal to or less than 5° (degree). Since the first material and the second material are neither completely crystalline nor amorphous, the heat resistance of the first material and the second material is improved.

Modification Example

Figure 4:
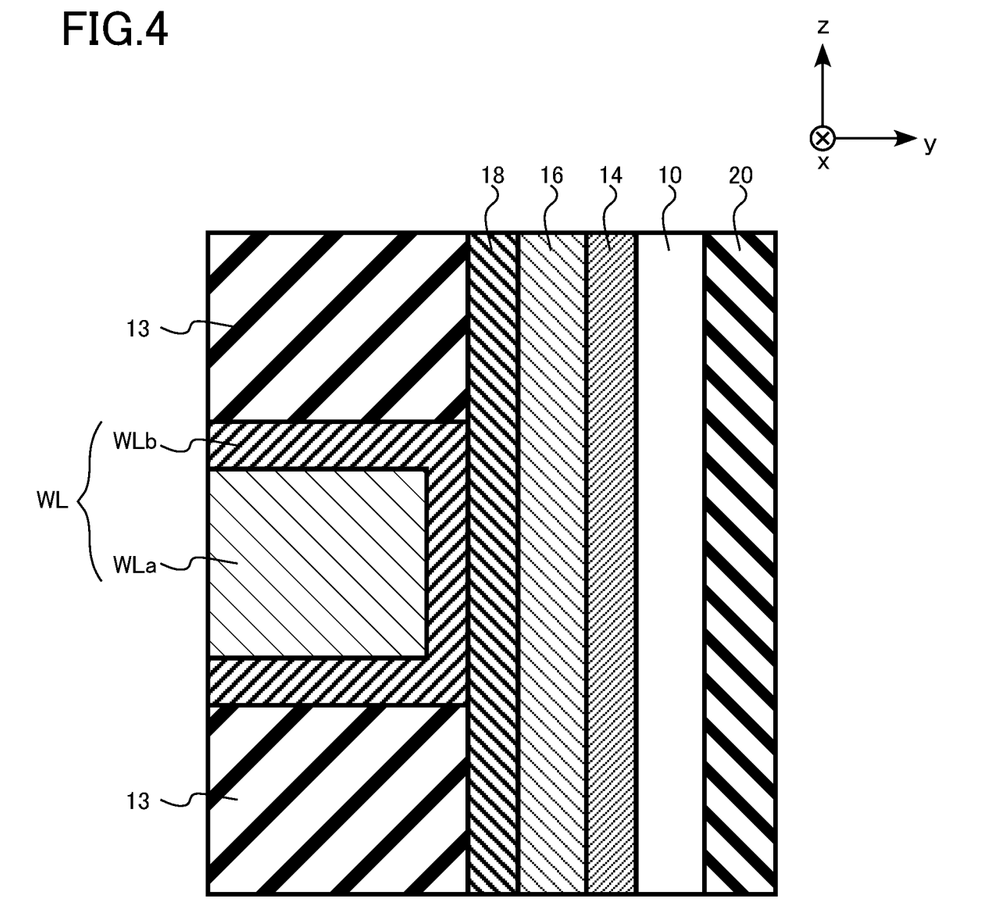
FIG. 4 is an enlarged view of a part of a memory cell of a memory device according to a modification example of the first embodiment.

A memory device according to a modification example of the first embodiment is different from the memory device according to the first embodiment in that the gate electrode layer includes a first region and a second region provided between the first region and the second insulating layer and the second region contains a first material or a second material.

FIG. 4 is an enlarged view of a part of a memory cell of the memory device according to the modification example of the first embodiment. FIG. 4 is a diagram corresponding to FIG. 3 of the first embodiment.

The word line WL includes a main metal region WLa and a barrier metal region WLb. The main metal region WLa is an example of a first region. The barrier metal region WLb is an example of a second region. The barrier metal region WLb is an example of a conductive layer.

The main metal region WLa is, for example, metal. The main metal region WLa contains, for example, tungsten (W) or molybdenum (Mo). The main metal region WLa is, for example, a tungsten layer or a molybdenum layer.

The barrier metal region WLb is provided between the main metal region WLa and the block insulating layer 18. The barrier metal region WLb contains a first material or a second material. The thickness of the barrier metal region WLb in the y direction is, for example, equal to or more than 0.5 nm and equal to or less than 5 nm.

The main metal region WLa does not contain, for example, the first material and the second material. The main metal region WLa may or may not contain nitrogen (N). The atomic concentration of nitrogen in the main metal region WLa is, for example, lower than the atomic concentration of nitrogen in the barrier metal region WLb.

By using the first material or the second material for the barrier metal region WLb, it is possible to realize the barrier metal region WLb having a small variation in electrical resistance due to heat treatment. By using the first material or the second material for the barrier metal region WLb, an increase in the electrical resistance of the barrier metal region WLb due to heat treatment is suppressed.

As described above, according to the 3D NAND flash memory of the first embodiment, it is possible to provide a memory device having a gate electrode layer containing a highly heat-resistant conductive material.

Second Embodiment

A memory device according to the second embodiment includes a first electrode, a second electrode, and a resistance change region provided between the first electrode and the second electrode. The first electrode contains a first material or a second material. The first material contains tantalum (Ta), tungsten (W), and nitrogen (N). The atomic concentration of nitrogen in the first material is less than the sum of the atomic concentration of tantalum and the atomic concentration of tungsten. The second material contains niobium (Nb), molybdenum (Mo), and nitrogen (N). The atomic concentration of nitrogen in the second material is less than the sum of the atomic concentration of niobium and the atomic concentration of molybdenum. The memory device according to the second embodiment is different from the memory device according to the first embodiment in that the memory cell structure is different. Hereinafter, the description of a part of the content overlapping the first embodiment may be omitted.

The memory device according to the second embodiment is a resistance change memory. The resistance change memory according to the second embodiment is, for example, a phase change memory or a memory using a superlattice structure.

For the phase change memory or the memory using a superlattice structure, for example, a material containing chalcogenide as a main component is used in a resistance change region. These memories store data by using, for example, a main resistance change mechanism in a chalcogenide-based material, that is, a resistance change according to a change in the crystal structure within the resistance change region or displacement of atoms in the crystal structure.

Figure 5:
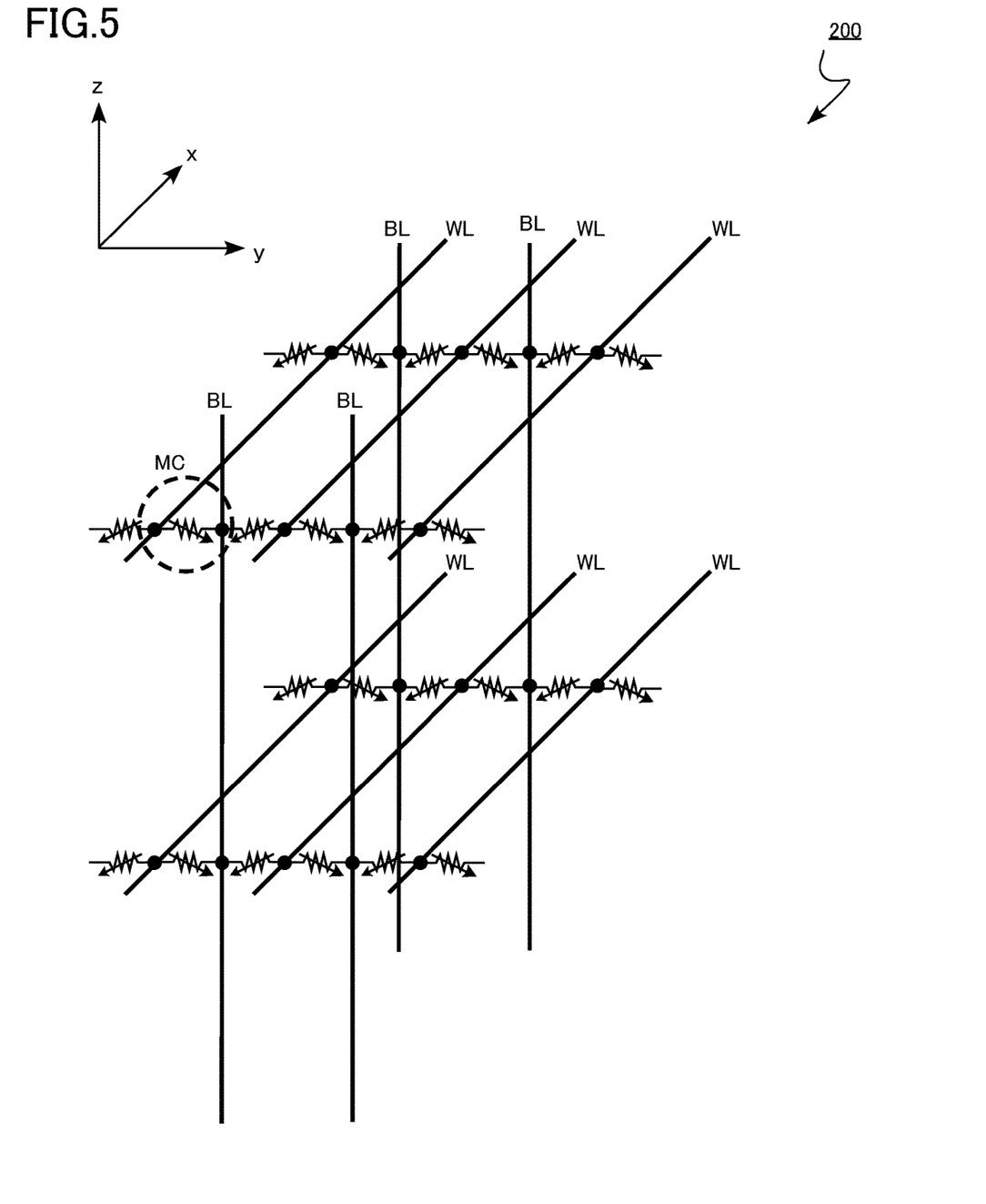
FIG. 5 is a circuit diagram of a memory cell array of a memory device according to a second embodiment.

FIG. 5 is a circuit diagram of a memory cell array of the memory device according to the second embodiment. FIG. 5 schematically shows a wiring structure in the memory cell array. The memory cell array 200 of the second embodiment has a three-dimensional structure in which memory cells MC are arranged in a three-dimensional manner.

As shown in FIG. 5, in the memory cell array 200, a plurality of memory cells MC are arranged in a three-dimensional manner. In FIG. 5, a region surrounded by the dotted line corresponds to one memory cell MC.

The memory cell array 200 includes, for example, a plurality of word lines WL and a plurality of bit lines BL. The word line WL extends in the x direction. The bit line BL extends in the z direction. The word line WL and the bit line BL cross perpendicular to each other. The memory cell MC is arranged at the intersection between the word line WL and the bit line BL.

Figure 6A:
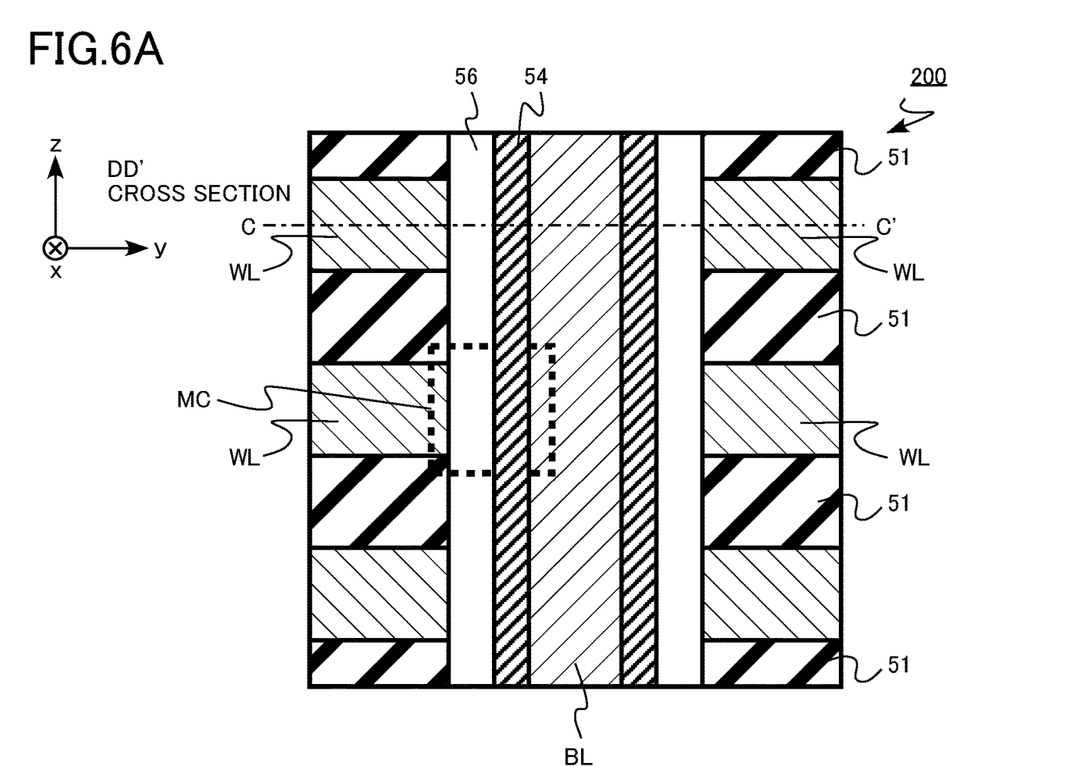
FIGS. 6A and 6B are schematic cross-sectional views of a part of the memory cell array of the memory device according to the second embodiment.
Figure 6B:
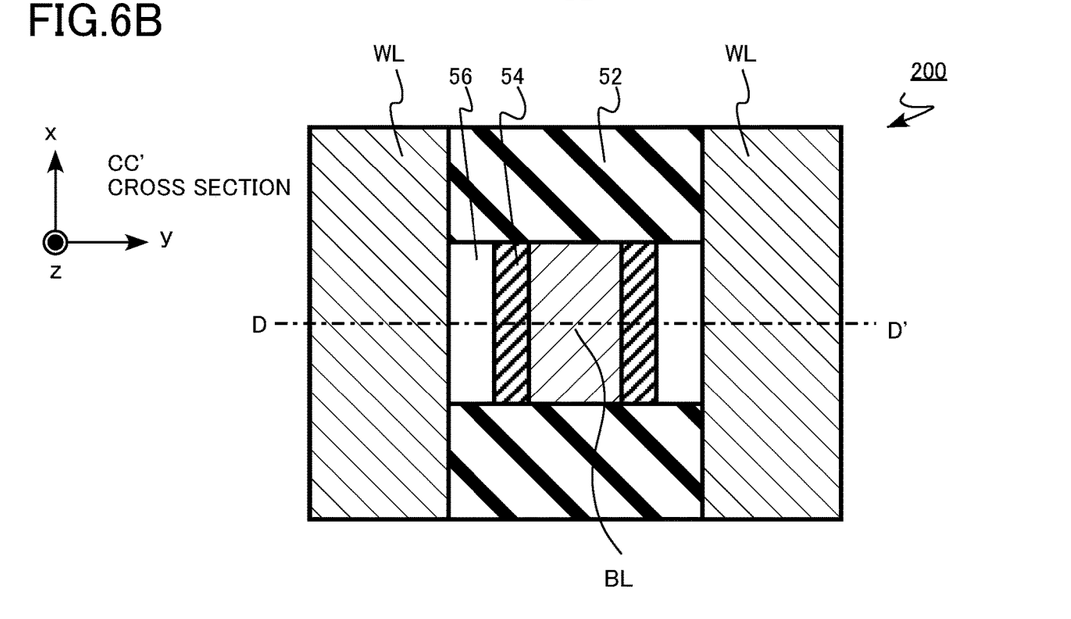

FIGS. 6A and 6B are schematic cross-sectional views of a part of the memory cell array of the memory device according to the second embodiment. FIG. 6A is a yz cross-sectional view of the memory cell array 200. FIG. 6B is an xy cross-sectional view of the memory cell array 200. FIG. 6A is a cross-sectional view taken along the line DD' of FIG. 6B, and FIG. 6B is a cross-sectional view taken along the line CC' of FIG. 6A. For example, in FIG. 6A, a region surrounded by the dotted line is one memory cell MC.

The memory cell array 200 includes a plurality of word lines WL, a plurality of bit lines BL, a first interlayer insulating layer 51, a second interlayer insulating layer 52, a resistance change layer 54, and a selector layer 56.

The word line WL is an example of a first electrode. The word line WL is an example of a conductive layer. The resistance change layer 54 is an example of a resistance change region. The selector layer 56 is an example of an intermediate region.

The word line WL and the first interlayer insulating layer 51 are alternately stacked in the z direction. The word line WL extends in the x direction.

The word line WL contains a first material or a second material. For example, the entire region of the word line WL is formed of a first material or a second material.

The first material contains tantalum (Ta), tungsten (W), and nitrogen (N), and the atomic concentration of nitrogen is less than the sum of the atomic concentration of tantalum and the atomic concentration of tungsten. In addition, the second material contains niobium (Nb), molybdenum (Mo), and nitrogen (N), and the atomic concentration of nitrogen is less than the sum of the atomic concentration of niobium and the atomic concentration of molybdenum.

The word line WL contains, for example, a first material. The main components of the first material are tantalum, tungsten, and nitrogen. The fact that the main components of the first material are tantalum, tungsten, and nitrogen means that there is no element having a higher atomic concentration than tantalum, tungsten, or nitrogen among the elements contained in the first material. The total atomic concentration of tantalum, tungsten, and nitrogen contained in the first material is, for example, equal to or more than 80%.

The first material contains, for example, tantalum tungsten nitride. The first material is, for example, tantalum tungsten nitride.

The word line WL is formed of, for example, the first material. The word line WL contains, for example, tantalum tungsten nitride. The word line WL is, for example, a tantalum tungsten nitride layer.

The atomic concentration of nitrogen in the first material is less than the sum of the atomic concentration of tantalum and the atomic concentration of tungsten. The atomic concentration of nitrogen in the first material is, for example, equal to or more than 80% and equal to or less than 95% of the sum of the atomic concentration of tantalum and the atomic concentration of tungsten.

The atomic concentration of tantalum in the first material is, for example, equal to or more than 0.3 times and equal to or less than of 3.3 times the atomic concentration of tungsten.

The word line WL contains, for example, the second material. The main components of the second material are niobium, molybdenum, and nitrogen. The fact that the main components of the second material are niobium, molybdenum, and nitrogen means that there is no element having a higher atomic concentration than niobium, molybdenum, or nitrogen among the elements contained in the second material. The total atomic concentration of niobium, molybdenum, and nitrogen contained in the second material is, for example, equal to or more than 80%.

The second material contains, for example, niobium molybdenum nitride. The second material is, for example, niobium molybdenum nitride.

The word line WL is formed of, for example, the second material. The word line WL contains, for example, niobium molybdenum nitride. The word line WL is, for example, a niobium molybdenum nitride layer.

The atomic concentration of nitrogen in the second material is less than the sum of the atomic concentration of niobium and the atomic concentration of molybdenum. The atomic concentration of nitrogen in the second material is, for example, equal to or more than 80% and equal to or less than 95% of the sum of the atomic concentration of niobium and the atomic concentration of molybdenum.

The atomic concentration of niobium in the second material is, for example, equal to or more than 0.3 times and equal to or less than of 3.3 times the atomic concentration of molybdenum.

The first material and the second material contain, for example, oxygen (O). The atomic concentration of oxygen contained in the first material and the second material is, for example, equal to or more than 5 atomic % and equal to or less than 20 atomic %.

The first material and the second material include, for example, polycrystalline portions. For example, all portions of the first material and the second material are polycrystalline portions.

In the polycrystalline portion of the first material and the second material, for example, the atomic concentration of oxygen in the crystal grain is lower than the atomic concentration of oxygen at the crystal grain boundary. In the polycrystalline portion of the first material and the second material, for example, oxygen segregates at the crystal grain boundary.

The first material and the second material contain, for example, at least one element selected from the group consisting of carbon (C), chlorine (Cl), hydrogen (H), and deuterium (D). The atomic concentration of the at least one element contained in the first material and the second material is, for example, equal to or more than 5 atomic % and equal to or less than 20 atomic %.

The first material and the second material are, for example, polycrystalline. In the X-ray diffraction of the first material and the second material using Cu-Kα rays, for example, the full width at half maximum of the diffraction peak present in the range of a diffraction angle 2θ (two theta) equal to or more than 15° (degree) and equal to or less than 30° (degree) is equal to or more than 1.3° (degree) and equal to or less than 5° (degree).

The thickness of the word line WL in the z direction is, for example, equal to or more than 5 nm and equal to or less than 20 nm.

The word line WL is formed by depositing a film of the first material or a film of the second material using a chemical vapor deposition (CVD) method, for example. By adjusting the composition of the source gas when forming the word line WL using the CVD method, it is possible to deposit the film of the first material or the film of the second material with a desired chemical composition.

The first interlayer insulating layer 51 is provided between the word lines WL. The first interlayer insulating layer 51 contains, for example, silicon oxide. The first interlayer insulating layer 51 is, for example, a silicon oxide layer.

The bit line BL crosses the word line WL. The bit line BL is provided between the word lines WL.

The bit line BL extends in the z direction. The z direction crosses the x direction. The z-direction is, for example, perpendicular to the x direction. The bit line BL contains, for example, metal. The bit line BL contains, for example, tungsten (W), titanium nitride (TiN), tungsten nitride (WN), tantalum nitride (TaN), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt).

The second interlayer insulating layer 52 is provided between the bit lines BL. The second interlayer insulating layer 52 is provided between the word lines WL. The second interlayer insulating layer 52 contains, for example, silicon oxide. The second interlayer insulating layer 52 is, for example, a silicon oxide layer.

The resistance change layer 54 stores data by changing the resistance state. In addition, the resistance change layer 54 can rewrite data by applying a voltage or a current.

The resistance change layer 54 transitions between a high resistance state and a resistance state by applying a voltage or a current. For example, the high resistance state is defined as data "0", and the low resistance state is defined as data "1". The memory cell MC stores 1-bit data of "0" and "1".

The resistance change layer 54 is, for example, a compound containing germanium (Ge), antimony (Sb), and tellurium (Te). The resistance change layer 54 is, for example, an alloy with a chemical composition of $Ge_2Sb_2Te_5$.

The resistance change layer 54 has, for example, a superlattice structure. The resistance change layer 54 is, for example, $Ge_2Sb_2Te_5$, and has a superlattice structure in which a $Ge_2Te_2$ region and an $Sb_2Te_3$ region are alternately stacked. The application of a voltage or a current changes the position of germanium (Ge) within the superlattice structure, resulting in a transition between a high resistance state and a low resistance state.

The selector layer 56 is provided between the bit line BL and the word line WL. The selector layer 56 is provided, for example, between the word line WL and the resistance change layer 54. The selector layer 56 may be provided, for example, between the bit line BL and the resistance change layer 54.

The selector layer 56 has a nonlinear current-voltage characteristic in which the current sharply rises at a specific voltage (threshold voltage). The selector layer 56 has a function of suppressing an increase in half-selected leakage current flowing through the half-selected cell. The selector layer 56 functions as a switching element.

The chemical composition of the selector layer 56 is different from the chemical composition of the resistance change layer 54. The material forming the selector layer 56 is different from the material forming the resistance change layer 54.

The selector layer 56 contains, for example, a first element selected from the group consisting of niobium (Nb), vanadium (V), tantalum (Ta), and titanium (Ti) and a second element selected from the group consisting of oxygen (O), sulfur (S), selenium (Se), and tellurium (Te).

For example, the selector layer 56 contains niobium oxide, vanadium oxide, tantalum oxide, titanium oxide, niobium sulfide, vanadium sulfide, tantalum sulfide, titanium sulfide, niobium selenide, vanadium selenide, tantalum selenide, titanium selenide, niobium telluride, vanadium telluride, tantalum telluride, or titanium telluride.

The thickness of the selector layer 56 in a direction from the bit line BL to the word line WL is, for example, equal to or more than 5 nm and equal to or less than 20 nm.

When manufacturing the memory cell array 200 according to the second embodiment, for example, the selector layer 56, the resistance change layer 54, and the bit line BL are formed after forming the word line WL. From the viewpoint of stabilizing the current-voltage characteristic of the selector layer 56, for example, heat treatment at a temperature equal to or more than 800° C. is performed when forming the selector layer 56.

In the memory device according to the second embodiment, since the first material or the second material with high heat resistance is used for the word line WL, it is possible to realize the word line WL with a small variation in electrical resistance due to heat treatment. By using the first material or the second material for the word line WL, an increase in the electrical resistance of the word line WL due to heat treatment is particularly suppressed.

As described above, according to the resistance change memory of the second embodiment, it is possible to provide a memory device including the word line WL containing a highly heat-resistant conductive material.

In the first embodiment, the case where the interlayer insulating layer 13 is provided between the word lines WL has been described as an example. However, there may be a cavity between the word lines WL, for example.

In addition, in the first embodiment, the structure in which the semiconductor layer 10 is surrounded by the word line WL has been described as an example. However, it is also possible to have a structure in which the semiconductor layer 10 is interposed between the two divided word lines WL. In the case of this structure, the number of memory cells in the stacked body 30 can be doubled.

In addition, in the first embodiment, the structure in which one semiconductor layer 10 is provided in one memory hole has been described as an example. However, it is also possible to adopt a structure in which a plurality of semiconductor layers 10, which are two or more divided semiconductor layers, are provided in one memory hole. In the case of this structure, the number of memory cells in the stacked body 30 can be doubled or more.

In addition, in the first embodiment, the case where the charge storage layer is an insulator has been described as an example. However, the charge storage layer may be a conductor, for example, a plurality of floating conductors electrically separated from each other.

In addition, in the second embodiment, the case where the resistance change memory has a superlattice structure has been described as an example. However, the memory device is not limited to this as long as the memory device is a two-terminal memory device that allows a current to flow through the resistance change layer. For example, the memory device may be a phase change memory, a resistance change memory, a magnetoresistive memory, or a ferroelectric memory other than the resistance change memory having a superlattice structure.

In addition, in the first and second embodiments, the word line WL was exemplified as an example of the conductive layer. However, the conductive layer is not limited to the word line WL.

In addition, in the first and second embodiments, the memory cell array having a three-dimensional structure has been described as an example. However, the memory cell array may have a two-dimensional structure.

While certain embodiments have been described, these embodiments have been presented by way of example only, and are not intended to limit the scope of the inventions. Indeed, the memory device and the conductive layer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device, comprising:
a semiconductor layer extending in a first direction;
a gate electrode layer containing a first material or a second material, the first material containing tantalum (Ta), tungsten (W), and nitrogen (N), an atomic concentration of nitrogen in the first material being less than a sum of an atomic concentration of tantalum and an atomic concentration of tungsten, the second material containing niobium (Nb), molybdenum (Mo), and nitrogen (N), and an atomic concentration of nitrogen in the second material being less than a sum of an atomic concentration of niobium and an atomic concentration of molybdenum;
a charge storage layer provided between the semiconductor layer and the gate electrode layer;
a first insulating layer provided between the semiconductor layer and the charge storage layer; and
a second insulating layer provided between the charge storage layer and the gate electrode layer.

2. The memory device according to claim 1,
wherein the atomic concentration of nitrogen in the first material is equal to or more than 80% and equal to or less than 95% of the sum of the atomic concentration of tantalum and the atomic concentration of tungsten, and
the atomic concentration of nitrogen in the second material is equal to or more than 80% and equal to or less than 95% of the sum of the atomic concentration of niobium and the atomic concentration of molybdenum.

3. The memory device according to claim 1,
wherein the atomic concentration of tantalum in the first material is equal to or more than 0.3 times and equal to or less than 3.3 times the atomic concentration of tungsten, and
the atomic concentration of niobium in the second material is equal to or more than 0.3 times and equal to or less than of 3.3 times the atomic concentration of molybdenum.

4. The memory device according to claim 1,
wherein each of the first material and the second material further contains oxygen (O).

5. The memory device according to claim 4,
wherein each of the first material and the second material includes a polycrystalline portion, and
in the polycrystalline portion, an atomic concentration of oxygen in a crystal grain is lower than an atomic concentration of oxygen at a crystal grain boundary.

6. The memory device according to claim 1,
wherein each of the first material and the second material further contains at least one element selected from a group consisting of carbon (C), chlorine (CI), hydrogen (H), and deuterium (D).

7. The memory device according to claim 1,
wherein, in X-ray diffraction of the first material and the second material using Cu-Kα rays, a full width at half maximum of a diffraction peak present in a range of a diffraction angle 2° equal to or more than 15° and equal to or less than 30° is equal to or more than 1.3° and equal to or less than 5°.

8. The memory device according to claim 1,
wherein the gate electrode layer includes a first region and a second region provided between the first region and the second insulating layer, and
the second region contains the first material or the second material.

9. The memory device according to claim 8,
wherein the first region contains or does not contain nitrogen, and
an atomic concentration of nitrogen in the first region is lower than an atomic concentration of nitrogen in the second region.

10. A memory device, comprising:
a first electrode;
a second electrode; and
a resistance change region provided between the first electrode and the second electrode,
wherein the first electrode contains a first material or a second material,
the first material contains tantalum (Ta), tungsten (W), and nitrogen (N),
an atomic concentration of nitrogen in the first material is less than a sum of an atomic concentration of tantalum and an atomic concentration of tungsten,
the second material contains niobium (Nb), molybdenum (Mo), and nitrogen (N), and
an atomic concentration of nitrogen in the second material is less than a sum of an atomic concentration of niobium and an atomic concentration of molybdenum.

11. The memory device according to claim 10,
wherein the atomic concentration of nitrogen in the first material is equal to or more than 80% and equal to or less than 95% of the sum of the atomic concentration of tantalum and the atomic concentration of tungsten, and the atomic concentration of nitrogen in the second material is equal to or more than 80% and equal to or less than 95% of the sum of the atomic concentration of niobium and the atomic concentration of molybdenum.

12. The memory device according to claim 10,
wherein the atomic concentration of tantalum in the first material is equal to or more than 0.3 times and equal to or less than 3.3 times the atomic concentration of tungsten, and
the atomic concentration of niobium in the second material is equal to or more than 0.3 times and equal to or less than 3.3 times the atomic concentration of molybdenum.

13. The memory device according to claim 10,
wherein each of the first material and the second material further contains oxygen (O).

14. The memory device according to claim 13,
wherein each of the first material and the second material includes a polycrystalline portion, and
in the polycrystalline portion, an atomic concentration of oxygen in a crystal grain is lower than an atomic concentration of oxygen at a crystal grain boundary.

15. The memory device according to claim 10,
wherein each of the first material and the second material further contains at least one element selected from a group consisting of carbon (C), chlorine (Cl), hydrogen (H), and deuterium (D).

16. The memory device according to claim 10,
wherein, in X-ray diffraction of the first material and the second material using Cu-Kα rays, a full width at half maximum of a diffraction peak present in a range of a diffraction angle 2° equal to or more than 15° and equal to or less than 30° is equal to or more than 1.3° and equal to or less than 5°.

17. The memory device according to claim 10, further comprising:
an intermediate region provided between the first electrode and the resistance change region or between the second electrode and the resistance change region, and
the intermediate region having a chemical composition different from a chemical composition of the resistance change region.

18. The memory device according to claim 17,
wherein the intermediate region contains a first element selected from a group consisting of niobium (Nb), vanadium (V), tantalum (Ta), and titanium (Ti) and a second element selected from a group consisting of oxygen (O), sulfur(S), selenium (Se), and tellurium (Te).

19. The memory device according to claim 18,
wherein the resistance change region contains germanium (Ge), antimony (Sb), and tellurium (Te).

20. A conductive layer, comprising:
a first material or a second material,
wherein the first material contains tantalum (Ta), tungsten (W), and nitrogen (N),
an atomic concentration of nitrogen in the first material is less than a sum of an atomic concentration of tantalum and an atomic concentration of tungsten,
the second material contains niobium (Nb), molybdenum (Mo), and nitrogen (N), and
an atomic concentration of nitrogen in the second material is less than a sum of an atomic concentration of niobium and an atomic concentration of molybdenum.

21. The conductive layer according to claim 20,
wherein the atomic concentration of nitrogen in the first material is equal to or more than 80% and equal to or less than 95% of the sum of the atomic concentration of tantalum and the atomic concentration of tungsten, and
the atomic concentration of nitrogen in the second material is equal to or more than 80% and equal to or less than 95% of the sum of the atomic concentration of niobium and the atomic concentration of molybdenum.

22. The conductive layer according to claim 20,
wherein the atomic concentration of tantalum in the first material is equal to or more than 0.3 times and equal to or less than 3.3 times the atomic concentration of tungsten, and
the atomic concentration of niobium in the second material is equal to or more than 0.3 times and equal to or less than of 3.3 times the atomic concentration of molybdenum.

23. The conductive layer according to claim 20,
wherein each of the first material and the second material contains oxygen (O).

24. The conductive layer according to claim 23,
wherein each of the first material and the second material includes a polycrystalline portion, and
in the polycrystalline portion, an atomic concentration of oxygen in a crystal grain is lower than an atomic concentration of oxygen at a crystal grain boundary.

25. The conductive layer according to claim 20,
wherein each of the first material and the second material further contains at least one element selected from a group consisting of carbon (C), chlorine (Cl), hydrogen (H), and deuterium (D).

26. The conductive layer according to claim 20,
wherein, in X-ray diffraction of the first material and the second material using Cu-Kα rays, a full width at half maximum of a diffraction peak present in a range of a diffraction angle 2° equal to or more than 15° and equal to or less than 30° is equal to or more than 1.3° and equal to or less than 5°.

* * * * *